(12) United States Patent
Takahashi

(10) Patent No.: US 6,687,074 B2
(45) Date of Patent: Feb. 3, 2004

(54) MAGNETIC RECORDING AND REPRODUCING APPARATUS CAPABLE OF PREVENTING DETERIORATION OF TRANSMISSION CHARACTERISTIC

(75) Inventor: Isao Takahashi, Miyagi-ken (JP)

(73) Assignee: ALPS Electric Co., Ltd, Tokyo (JP)

( * ) Notice: Subject to any disclaimer, the term of this patent is extended or adjusted under 35 U.S.C. 154(b) by 195 days.

(21) Appl. No.: 09/907,416

(22) Filed: Jul. 16, 2001

(65) Prior Publication Data

US 2002/0051869 A1 May 2, 2002

(30) Foreign Application Priority Data

Jul. 19, 2000 (JP) ........................................ 2000-223844

(51) Int. Cl.[7] ................................................. G11B 5/02
(52) U.S. Cl. .............................. 360/67; 360/46; 360/65; 360/68
(58) Field of Search ............................. 360/46, 67, 65, 360/66, 68

(56) References Cited

U.S. PATENT DOCUMENTS

| 4,789,908 | A | * | 12/1988 | Eiberger ...................... 360/65 |
| 4,926,007 | A | * | 5/1990 | Aufderheide et al. ......... 174/36 |
| 5,639,989 | A | * | 6/1997 | Higgins, III ........... 174/35 MS |
| 6,151,188 | A | * | 11/2000 | Takano et al. ................. 360/95 |
| 6,246,590 | B1 | * | 6/2001 | Nakai et al. ................. 361/803 |

FOREIGN PATENT DOCUMENTS

JP          2504908          5/1996

* cited by examiner

Primary Examiner—David Hudspeth
Assistant Examiner—Natalia Figueroa
(74) Attorney, Agent, or Firm—Beyer Weaver & Thomas

(57) ABSTRACT

The present invention relates to a structure of a magnetic recording and reproducing apparatus including a flexible substrate for transmission and reception of signals, and provides a structure of a magnetic recording and reproducing apparatus capable of preventing deterioration of the transmission characteristic, without increasing the cost, by suppressing the capacitance generated between the signal lines and the shield layer. The magnetic recording and reproducing apparatus according to the present invention includes: a flexible substrate 1 on which a plurality of signal lines 2 for transmitting and receiving signals from and to external circuits and grand lines 3 are formed and a shield layer 4 formed to face the signal lines 2 and said grand lines 3, wherein areas of the portion of the shield layer 4 covering each pair of signal lines 2a, 2b among the plurality of signal lines 2 are different from one another.

6 Claims, 4 Drawing Sheets

MAGNETIC RECORDING AND REPRODUCING APPARATUS CAPABLE OF PREVENTING DETERIORATION OF TRANSMISSION CHARACTERISTIC

BACKGROUND OF THE INVENTION

1. Field of the Invention

The present invention relates to a magnetic recording and reproducing apparatus and specifically, to a flexible substrate structure for transmission and reception of signals, used in a rotating head unit for broadband storage such as a video tape recorder (VTR) and the like.

2. Description of the Related Art

In a magnetic recording and reproducing apparatus such as VTR and the like, a rotating head unit for carrying out recording and reproducing of external information is provided. In this rotating head unit, a flexible substrate is generally used as a support for signal lines for transmission and reception of signals from and to a rotary transformer, and on the flexible substrate, a plurality of signal lines and grand lines are provided.

In general, in order to prevent influence of external electromagnetic interference noises, a shield layer is formed on the flexible substrate, opposed to the plurality of signal lines. However, because the shield layer causes an increase of capacitance, the shield layer is formed not as a whole surface shield layer but, for example, as a mesh type of shield layer etched in a grid shape. The mesh type of shield layer is formed on the plurality of signal lines at equal intervals i.e., areas of the coated portions and the uncoated portions in the shield layer are almost equal.

However, in the flexible substrate structure for transmission and reception of signals in the conventional magnetic recording and reproducing apparatus described above, there is a problem that the transmission characteristic is deteriorated. A loss in transmission of signals naturally occurs due to the capacitance between the signal lines or between the signal line and the shield layer, when the structure is used in the rotating head unit for a broadband storage. Also, there is a problem that if the loss in transmission is compensated for by addition of other parts, manufacturing cost can be increased.

Therefore, the present invention is made in order to solve the above problems. Thus an object of the present invention is to provide a structure for a magnetic recording and reproducing apparatus including a flexible substrate for transmission and reception of signals, that is capable of preventing deterioration of the transmission characteristic without increasing cost, by suppressing the capacitance between signal lines and a shield layer.

SUMMARY OF THE INVENTION

In order to solve the above problems, according to a first aspect of the present invention, there is provided a magnetic recording and reproducing apparatus comprising: a flexible substrate on which is formed a plurality of signal lines for transmission and reception of signals from and to external circuits and grand lines; and a shield layer formed to be opposed to the signal lines and the grand lines, wherein portions of the shield layer covering each member of a pair of signal lines among the plurality of signal lines are different in area from one another.

Also, according to a second aspect of the present invention, there is provided a magnetic recording and reproducing apparatus wherein each pair of the plurality of signal lines comprises balanced signal lines that are connected to the terminals of a differential amplifier. In this aspect of the present invention the area of the shield layer covering the signal lines connected to an inverting input terminal of the differential amplifier is smaller than area of the shield layer covering the signal lines connected to a non-inverting input terminal.

Also, according to a third aspect of the present invention, there is provided a magnetic recording and reproducing apparatus wherein a plurality of openings is formed in the shield layer oppositely facing and covering the signal lines. The areas of the portion of the shield layer covering the signal lines are different according to the number of the openings provided in the shield layer.

Also, according to a fourth aspect of the present invention, there is provided a magnetic recording and reproducing apparatus wherein a plurality of openings is formed in the shield layer oppositely facing and covering the signal lines. The areas of the portion of the shield layer covering the signal lines are different according to the size of the openings provided in the shield layer.

Also, according to a fifth aspect of the present invention, there is provided a magnetic recording and reproducing apparatus wherein signals transmitted to the signal lines are broadband signals.

BRIEF DESCRIPTION OF THE DRAWINGS

The above objects, other objects, features and advantages of the present invention will be better understood from the following description taken in conjunction with the accompanying drawings, in which.

DETAILED DESCRIPTION OF THE PREFERRED EMBODIMENTS

Figure 1:
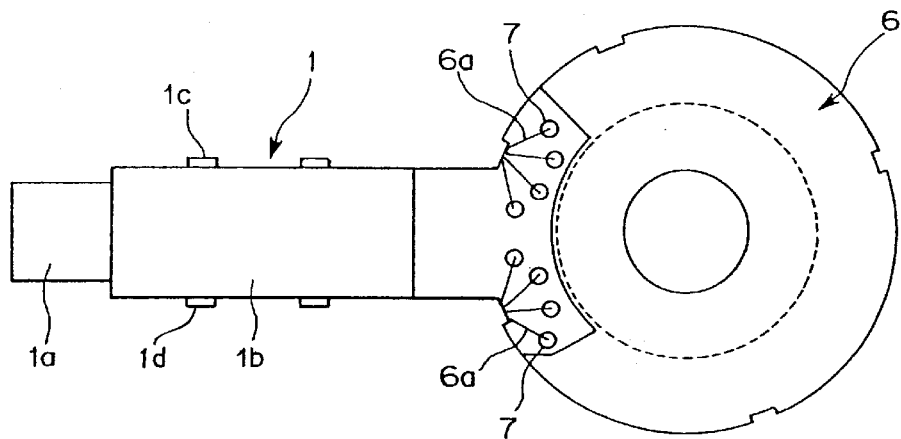
FIG. 1 is a plan view of rotary transformer to which a flexible substrate according to a first embodiment of the present invention is connected.
Figure 2:
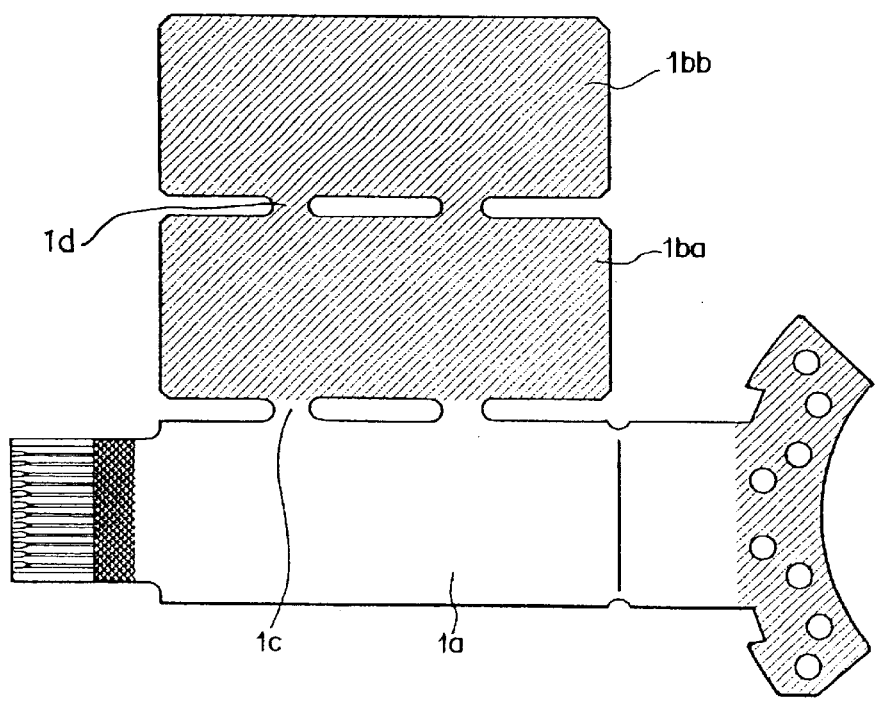
FIG. 2 is a plan view showing a state where the flexible substrate of the present invention is further developed.
Figure 3:
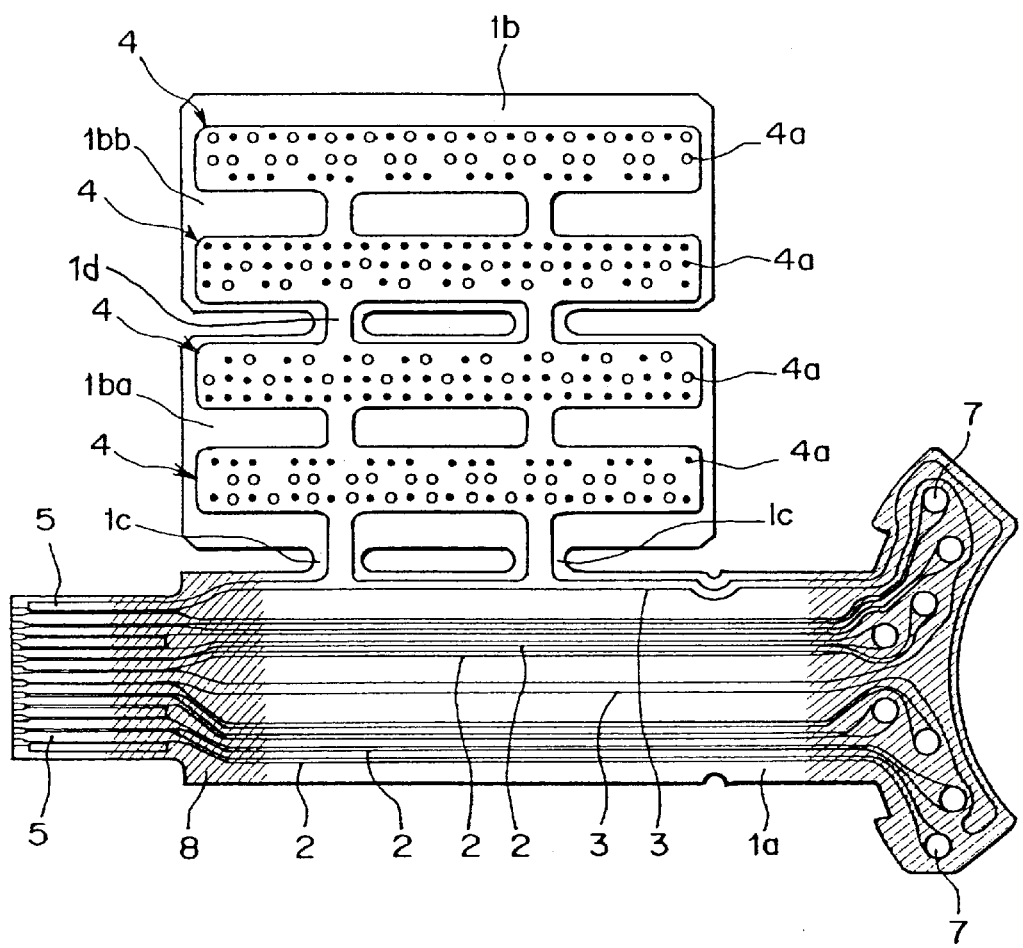
FIG. 3 is a plan view showing signal lines and shield layer of the flexible substrate of the present invention.
Figure 4:
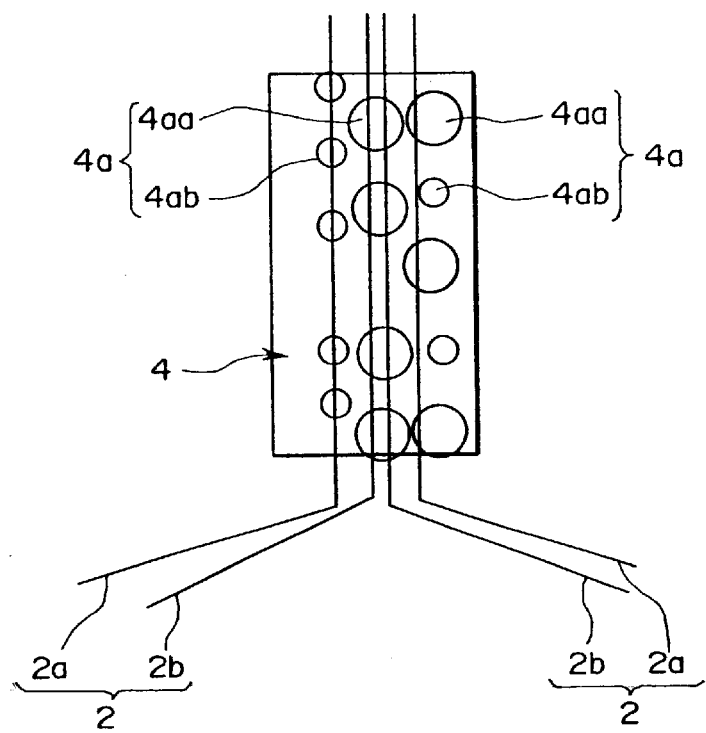
FIG. 4 is a simple explanatory diagram showing an arrangement of the signal lines and the shield layer according to the present invention.
Figure 5:
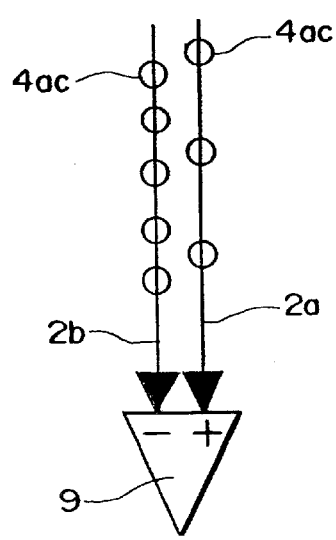
FIG. 5 is a simple explanatory diagram showing an arrangement of a pair of balanced signal lines connected to the input terminals of an operational amplifier according to the present invention.
Figure 6:
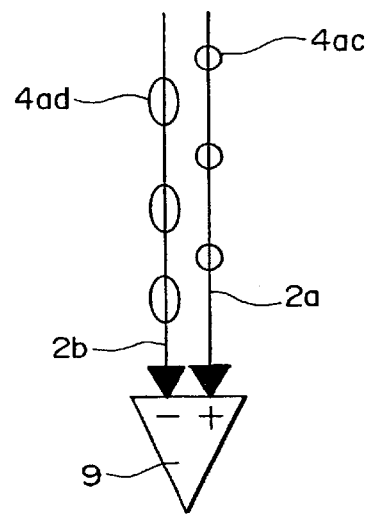
FIG. 6 is a simple explanatory diagram showing another arrangement of a pair of balanced signal lines connected to the input terminals of an operational amplifier according to the present invention.
Figure 7:
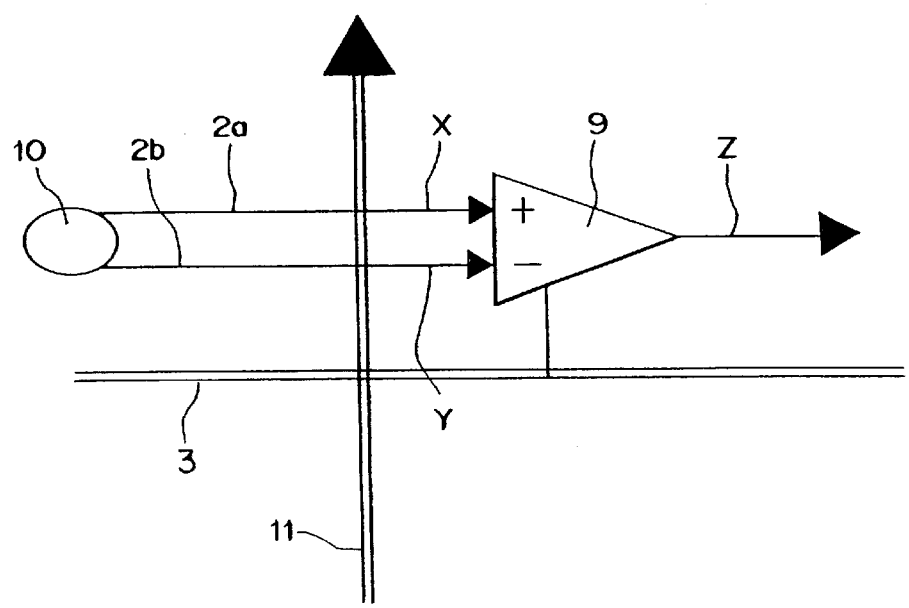
FIG. 7 is a simple circuit diagram showing the relationship between outside electromagnetic interference noise and the output side of the operational amplifier according to the present invention.

Now, a first embodiment of the present invention will be explained with reference to FIG. 1 through FIG. 7. FIG. 1 is a plan view of rotary transformer to which a flexible substrate according to a first embodiment of the present invention is connected; FIG. 2 is a plan view showing a state where the flexible substrate of the present invention is further developed; FIG. 3 is a plan view showing signal lines and shield layer of the flexible substrate of the present invention; FIG. 4 is a simple explanatory diagram showing an arrangement of the signal lines and the shield layer according to the present invention; FIG. 5 is a simple explanatory diagram showing an arrangement of a pair of balanced signal lines connected to the input terminals of an operational amplifier according to the present invention; FIG. 6 is a simple explanatory diagram showing another arrangement of a pair of balanced signal lines connected to the input terminals of the operational amplifier according to the present invention; and FIG. 7 is a simple circuit diagram showing the relationship between outside electromagnetic interference noise and the output side of the operational amplifier according to the present invention.

In the drawings, a flexible substrate 1 is made of resin such as polyimide and the like, in form of a film, and comprises a flexible electrically insulating signal substrate 1a in which a plurality of signal lines 2 and grand lines 3 made of conductive metal material such as a copper foil and the like are formed on a surface thereof and a flexible shield substrate 1b having a shield layer 4 formed with a plurality of openings 4a thereon.

At one end of the flexible signal substrate 1a, terminals 5 formed parallel to each other are derived from the plurality of signal lines 2 and grand lines 3 and at the same time, are connected to a connector or a substrate of amplifier and the like (not shown). At the opposite end of the flexible signal structure a plurality of connecting pads 7, derived from the plurality of signal lines 2, are connected through connecting lines 6a to coils (not shown) at the fixed side of a rotary transformer 6 for transmission and reception of signals from and to a rotating magnetic head (not shown).

The flexible shield substrate 1b extends at one side of the flexible signal substrate 1a through bendable first connecting parts 1c. The flexible shield substrate 1b includes a first shield substrate 1ba positioned above and facing the upper surface of the flexible signal substrate 1a by bending the first connecting parts 1c. The flexible shield substrate also includes a second shield substrate 1bb, connected to the first shield substrate 1ba through bendable second connecting parts 1d, and positioned below and facing the flexible signal substrate 1a by bending the second connecting parts 1d after positioning the first shield substrate 1ba. On the first shield substrate 1ba and the second shield substrate 1bb, the plurality of shield layers 4, made of conductive metal material such as a copper foil and the like, are formed to be connected to the grand lines 3 formed on the flexible signal substrate 1a and cover the plurality of signal lines 2.

Also, in the shield layers 4, a plurality of openings 4a are formed along the same direction as the signal lines 2 at a position opposed to the signal lines 2. Openings 4a are different in size or number according to the kinds of the signal lines 2.

By bending and winding the first shield substrate 1ba and the second shield substrate 1bb of the flexible shield substrate 1b above and below and facing the surfaces of the flexible signal substrate 1a, the plurality of signal lines 2 and the shield layers 4 are superposed and face each other to integratedly form a flexible substrate 1. In this case, an insulating layer 8 (only partially shown for clarity by a hatching pattern in FIG. 3) made of insulating resin material such as an epoxy resin and the like is laminated on the signal lines 2 at the surface of the flexible signal substrate 1a to prevent the signal lines 2 and the shield layers 4 from short circuiting when the first shield substrate 1ba is superposed.

Because reproduced output from the rotating head unit is small and is easily susceptible to noises from a system clock or a motor and the like, the influence of the external noises can be reduced by forming the shield layers 4 on the signal lines of the flexible signal substrate 1a. However, if the shield layers 4 are formed, the capacitance between the signal lines 2 or between the signal lines 2 and the shield layers 4 increases. There is a problem that in the rotating head unit for broadband storage, a loss of signal transmission can more easily occur due to the increased capacitance and thus transmission characteristic is deteriorated.

Therefore, in order to accomplish a low capacitance in the above embodiment of the flexible substrate 1, the plurality of openings 4a are formed at the shield layers 4 along the same direction as the signal lines 2 such that the size or the number thereof differs according to the kinds of the signal lines 2.

Successively, the construction of the openings 4a will be explained with reference to FIG. 4 through FIG. 6.

FIG. 4 shows a case of transmission and reception of signals from and to two rotating magnetic heads, in which the signal lines 2 are formed by two channels. The signal lines 2 in every channel comprise balanced signal lines including a plus signal line 2a connected to the non-inverting input terminal (plus input side) of a differential amplifier 9 and a minus signal line 2b connected to the inverting input terminal (minus input side).

In the shield layers 4, a plurality of openings 4a are formed along the direction of signal lines 2 and on the left minus signal line 2b, somewhat large circular first openings 4aa (four in number in FIG. 4) are formed. Also, on the left plus signal line 2a in FIG. 4, somewhat small circular second openings 4ab (five in number in FIG. 4) are formed and on the right plus signal line 2a, the first openings 4aa are formed, the number thereof being smaller (three in FIG. 4) than the number of the first openings 4aa formed on the left plus signal 2a In this case, the area of the portion of the shield layers 4 covering the minus signal line 2b connected to the inverting input terminal of the differential amplifier 9 is smaller than that of the area of the portion of the shield layers 4 covering the plus signal line 2a connected to the non-inverting input terminal according to the size or the number of the openings 4a formed in the shield layers 4.

FIGS. 5 and 6 more understandably show the construction of the openings 4a formed in the shield layers 4. FIG. 5 exemplifies the state wherein the size of the openings 4a is equal but the number thereof is different, and FIG. 6 exemplifies the state wherein the number of the openings 4a is equal but the size thereof is different.

In FIG. 5, on the plus signal line 2a connected to the non-inverting input terminal of the differential amplifier 9, three third openings 4ac are formed, and on the minus signal line 2b connected to the inverting input terminal opposed to it, five of the third openings 4ac having the same size are formed. As a result, the area of the portion of the shield layer 4 covering the minus signal line 2b connected to the inverting input terminal is smaller than that of the shield layer 4 covering the plus signal line 2a connected to the non-inverting input terminal.

Also, in FIG. 6, on the plus signal line 2a connected to the non-inverting input terminal of the differential amplifier 9, three of the third openings 4ac are formed and on the minus signal line 2b connected to the inverting input terminal, three fourth openings 4ad are formed. The fourth openings 4ad have an approximately elliptical shape, in which the length in the signal line direction is longer than that of the third openings 4ac. As a result, area of the portion of the shield layer 4 covering the minus signal line 2b connected to the inverting input terminal is smaller than that of the portion of the shield layer 4 covering the plus signal line 2a connected to the non-inverting input terminal.

In the flexible substrate 1 of the present invention described above, because of the arrangement of the plurality of openings 4a formed in the shield layers 4, the area of the shield layer 4 covering the minus signal line 2b connected to the inverting input terminal of the differential amplifier 9 is smaller than that of the shield layer 4 covering the plus signal line 2a connected to the non-inverting input terminal. Thus noise outputted from the output side of the differential amplifier 9 is always small (almost cancelled). The noise remaining without complete canceling is small due to the directly opposing noise phases of the signal lines 2a and 2b to each other and due to the directly opposing noise phase of the signal lines 2a to the phase of the noise generated in the grand lines 3 which weaken each other.

Therefore, when the flexible substrate 1 of the present invention is used in the rotating head unit for broadband storage, it is possible to prevent the transmission characteristic from being deteriorated due to the loss in signal transmission by the action of capacitance generated between the signal lines 2 or between the signal lines 2 and the shield layers 4.

Next, with reference to FIG. 7, a relationship between external noise and output of the differential amplifier will be explained. Also, in a circuit diagram of FIG. 7, output of a signal source 10 is assumed to be zero for simplification.

First, when the output of the signal source 10 is zero and the external noise 11 is zero (case 1), both of the non-inverting input terminal side (input X) and the inverting input terminal side (input Y) of the differential amplifier 9 is zero and the output Z thereof is zero.

Next, when the output of the signal source 10 is zero and the external noise 11 occurs equally only in the input (signal) lines 2a, 2b (case 2), because the noise phase of the non-inverting input terminal side (input X) and the inverting input terminal side (input Y) become directly opposite they cancel each other, and the output Z of differential amplifier 9 is zero.

Next, when the output of the signal source 10 is zero and the external noise 11 occurs unequally in the input (signal) lines 2a, 2b so that occurrence of the noise between the input lines 2a, 2b is different (case 3), the noise phases of the non-inverting input terminal side (input X) and the inverting input terminal side (input Y) are again directly opposite from each other but do not completely cancelled because they are of unequally magnitude and the remaining uncancelled noise runs out of the output Z.

Next, when the output of the signal source 10 is zero and the external noise 11 does not occur in the input (signal) lines 2a, 2b but occurs in the grand lines 3 (case 4), both of the non-inverting input terminal side (input X) and the inverting input terminal side (input Y) are zero but if the noise on the grand lines 3 induces fluctuation in the current and voltage in the grand lines 3, the induced noise runs out of the output Z.

Next, when the output of the signal source 10 is zero and the external noise 11 occurs in the input (signal) lines 2a, 2b equally and also occurs in the grand lines 3 (case 5), the noise phases of the non-inverting input terminal side (input X) and the inverting input terminal side (input Y) become directly opposite phases to cancel each other while the noise generated in the grand lines 3 runs out of the output Z.

Next, when the output of the signal source 10 is zero and the external noise 11 occurs to a greater extent in the input (signal) lines 2a than it does in input line (signal) lines 2b and also occurs in the grand lines 3 (case 6), the noise phases of the non-inverting input terminal side (input X) due to signal lines 2a and the inverting input terminal (input Y) due to signal lines 2b are directly opposite from each other so that the noise remaining without being completely cancelled and the noise generated in the grand lines 3 are directly in phase with and additive to each other so that the noise out of the output Z becomes relatively great.

Next, when the output of the signal source 10 is zero, and the external noise 11 occurs to a greater extent in the in the input (signal) lines 2b than it does in input (signal) lines 2a and also occurs in the grand lines 3 (case 7), the noise phases of the non-inverting input terminal side (input X) due to signal lines 2a and the inverting input terminal side (input Y) due to signal lines 2b are directly opposite from each other so that the noise remaining without being completely cancelled and the noise generated in the grand lines 3 are in directly opposite phases and act to cancel each other so that the noise out of the output Z become small (almost cancelled).

In evaluating case 6 and the case 7 described above, because in the present invention the area of the shield layer covering the minus signal line 2b connected to the inverting input terminal of the differential amplifier is manipulated to be smaller than the area of the shield layer covering the plus signal line 2a connected to the non-inverting input terminal, the relationship between the external noise 11 and the output of the differential amplifier 9 may always be placed in state of the above case 7. Consequently, it is possible to set the noise out of the output of the differential amplifier 9 to be always small. Therefore, the loss in signal transmission can be always reduced to improve the transmission characteristic.

Also, when the openings 4a are not formed in the shield layer 4, the shield effect is increased so that it is difficult to be affected by the external noise 11, but there are problems that the capacitance of the signal lines 2 or the grand lines 3 is increased due to the shield layers 4 so that the transmission bandwidth becomes narrow or noise at the output side is increased when noise also occurs in the grand lines 3.

According to the construction of the present invention, because the shield area can be reduced by forming the plurality of openings 4a in the shield layer 4, the transmission bandwidth can be set wide, and because the remaining noise between the signal lines 2a, 2b, generated due to difference in the shield area between the signal lines 2a, 2b, and the noise generated in the grand lines 3 are directly out of phase and tend to cancelled each other (both weakened), so that it is possible to suppress amount of noise at the output side as much as when the shield area is complete and uniform.

As described above, because the magnetic recording and reproducing apparatus of the present invention comprises: a flexible substrate formed with a plurality of signal lines for transmission and reception of signals from and to external circuits and grand lines; and a shield layer formed to be opposed to the signal lines and the grand lines, wherein areas of the portion of the shield layer covering each member of the pair of signal lines among the plurality of signal lines are different from one another, it is possible to prevent the transmission characteristic from being deteriorated due to the loss in signal transmission by the action of capacitance generated between the signal lines or between the signal lines and the shield layers.

Also, because the pair of signal lines are made of balanced signal lines and the balanced signal lines are connected to a differential amplifier, and at the same time, area of the shield layer covering the signal line connected to an inverting input terminal of the differential amplifier is smaller than area of the shield layer covering the signal lines connected to a non-inverting input terminal, remaining uncancelled noise from the signal lines and noise generated in the grand lines have opposite phases to weaken (be cancelled) each other, and thus noise outputted from the output side of the differential amplifier can always be relatively small.

Also, because a plurality of openings are formed in the shield layer covering the signal lines so as to face the signal lines and areas of the shield layer covering the signal lines are different according to the number of the openings, the capacitance between the signal lines can be reduced by a simple construction and at the same time, the loss in signal transmission is reduced.

Also, because a plurality of openings are formed in the shield layer covering the signal lines so as to face the signal lines and areas of the shield layer covering the signal lines are different according to the size of the openings, the capacitance between the signal lines can be reduced by the simple construction and at the same time, the loss in signal transmission is reduced.

Also, even when the signal transmitted to the signal lines is a broadband signal and it is used in the rotating head unit for broadband storage, the loss in signal transmission can be reduced to prevent deterioration of the transmission characteristic.

Although only a few embodiments of the present invention have been described, it should be understood that the present invention may be embodied in many other specific forms without departing from the spirit or the scope of the present invention. By way of example, the present invention is capable of preventing deterioration of transmission characteristic in apparatuses other than magnetic recording and reproducing apparatuses A few different shield layer and shield hole arrangements have been specifically discussed. However, it should be apparent that these arrangements can be widely varied to meet the needs of a particular application.

What is claimed is:

1. A magnetic recording and reproducing apparatus comprising:
    a flexible substrate having formed thereon a plurality of signal lines for transmission and reception of signals from and to external circuits and grand lines; and
    a shield layer formed to face said signal lines and said grand lines;
    wherein areas of the portion of the shield layers covering each member of individual pairs of signal lines among said plurality of signal lines are different from one another;
    wherein a plurality of openings are formed in the portion of the shield layer covering said signal lines so as to face first and second signal lines among said signal lines; and
    wherein a first number of the opening facing the first signal line is different from a second number of the openings facing the second signal line.

2. A magnetic recording and reproducing apparatus according to claim 1, wherein said pairs of signal lines comprise balanced signal lines and said balanced signal lines are connected to a differential amplifier, and the area of the portion of the shield layer covering the signal lines connected to an inverting input terminal of said differential amplifier is smaller than area of the portion of the shield layer covering the signal lines connected to a non-inverting input terminal.

3. A magnetic recording and reproducing apparatus according to claim 1, wherein signals transmitted to said signal lines are broadband signals.

4. A magnetic recording and reproducing apparatus comprising:
    a flexible substrate having formed thereon a plurality of signal lines for transmission and reception of signals from and to external circuits and grand lines; and
    a shield layer formed to face said signal lines and said grand lines;
    wherein areas of the portion of the shield layers covering each member of individual pairs of signal lines among said plurality of signal lines are different from one another;
    wherein a plurality of openings are formed in the portion of the shield layer covering said signal lines so as to face first and second signal lines among said signal lines; and
    wherein a first size of the openings facing the first signal line is different from a second size of the openings facing the second signal line.

5. A magnetic recording and reproducing apparatus according to claim 4, wherein said pairs of signal lines comprising balanced signal lines and said balanced signal lines are connected to a differential amplifier, and the area of the portion of the shield layer covering the signal lines connected to an inverting input terminal of said differential amplifier is smaller than area of the portion of the shield layer covering the signal lines connected to a non-inverting input terminal.

6. A magnetic recording and reproducing apparatus according to claim 4, wherein signals transmitted to said signal lines are broadband signals.

* * * * *